US009627197B2

(12) United States Patent
Chen et al.

(10) Patent No.: US 9,627,197 B2
(45) Date of Patent: Apr. 18, 2017

(54) COMPOSITE SUBSTRATE, SEMICONDUCTOR DEVICE INCLUDING THE SAME, AND METHOD OF MANUFACTURING THE SAME

(71) Applicants: GLOBALWAFERS CO., LTD., Hsinchu (TW); Miin-Jang Chen, Taipei (TW)

(72) Inventors: Miin-Jang Chen, Taipei (TW); Huan-Yu Shih, Hsinchu (TW); Wen-Ching Hsu, Hsinchu (TW); Ray-Ming Lin, Hsinchu (TW)

(73) Assignee: GLOBALWAFERS CO., LTD., Hsinchu Science Park (TW)

( * ) Notice: Subject to any disclaimer, the term of this patent is extended or adjusted under 35 U.S.C. 154(b) by 0 days.

(21) Appl. No.: 14/687,684

(22) Filed: Apr. 15, 2015

(65) Prior Publication Data

US 2015/0294857 A1    Oct. 15, 2015

(30) Foreign Application Priority Data

Apr. 15, 2014 (TW) .............................. 103113608 A

(51) Int. Cl.
| | |
|---|---|
| *H01L 21/02* | (2006.01) |
| *H01L 31/036* | (2006.01) |
| *H01L 33/32* | (2010.01) |
| *H01L 33/00* | (2010.01) |
| *H01L 33/12* | (2010.01) |

(52) U.S. Cl.
CPC ...... *H01L 21/0254* (2013.01); *H01L 21/0262* (2013.01); *H01L 31/036* (2013.01); *H01L 33/007* (2013.01); *H01L 33/0095* (2013.01); *H01L 33/12* (2013.01); *H01L 33/32* (2013.01)

(58) Field of Classification Search
CPC ............... H01L 21/0254; H01L 33/007; H01L 33/0095; H01L 33/12; H01L 21/0262; H01L 33/32; H01L 31/036
See application file for complete search history.

(56) References Cited

U.S. PATENT DOCUMENTS 6,841,274 B2 *  1/2005  Ueno ..................... C30B 25/02
                                                  117/952

FOREIGN PATENT DOCUMENTS

TW          201331987 A      8/2013

OTHER PUBLICATIONS

Examination Report for TW 104112086 dated Jun. 20, 2016, 5 pages.
Search Report for TW 104112086 dated Jun. 16, 2016, 1 page.

* cited by examiner

*Primary Examiner* — David Vu
(74) *Attorney, Agent, or Firm* — Lynette Wylie; Apex Juris, pllc.

(57) ABSTRACT

The invention provides a composite substrate, a semiconductor device including such composite substrate, and a method of making the same. In particular, the composite substrate of the invention includes a nitride-based single crystal layer transformed from a nitride-based poly-crystal layer, which has a specific thickness of approximately between 2 nm and 100 nm.

10 Claims, 8 Drawing Sheets

COMPOSITE SUBSTRATE, SEMICONDUCTOR DEVICE INCLUDING THE SAME, AND METHOD OF MANUFACTURING THE SAME

BACKGROUND OF THE INVENTION

1. Technical Field

The present invention relates generally to a composite substrate, a semiconductor device which includes the composite substrate, and a method of manufacturing the composite substrate; the present invention relates more particularly to a composite substrate with a high quality nitride-based single crystal layer, a semiconductor device which includes the composite substrate, wherein the semiconductor device can be, for example, a nitride-based semiconductor light-emitting device, a high electron mobility transistor (HEMT), a metal-oxide-semiconductor field-effect-transistor (MOSFET), a laser diode, etc., and a method especially for manufacturing the nitride-based semiconductor light-emitting device of which a nitride-based multi-layer structure on the composite substrate has lower defect density, and a turn-on voltage less than 2.9 V while provided with an input current of 20 mA.

2. Description of Related Art

A semiconductor device such as a semiconductor light-emitting device, a HEMT, a MOSFET, a laser diode, etc., is typically has a buffer layer provided therein to improve the quality of the subsequent epitaxy and the device itself. The related technique is conventional, for the prior art is referred to in U.S. Pat. No. 7,834,343, No. 7,666,765, and Taiwan patent publication No. 201331987.

Take a semiconductor light-emitting device for example, with a buffer layer provided between a crystal substrate and a multi-layer light-emitting structure thereof, the problem of lattice mismatch between the multi-layer light-emitting structure and the crystal substrate can be eased, and the defect density of the light-emitting layer, especially the density of threading dislocations, can be reduced as well. Furthermore, the buffer layer also contributes to decrease the thermal expansion coefficient difference between the multi-layer light-emitting structure and the crystal substrate.

In recent years, nitride-based semiconductor materials are widely used in light-emitting devices of blue waveband. A conventional nitride-based semiconductor light-emitting device typically has a sapphire substrate, and has a nitride buffer layer, which typically is a GaN/AlN buffer layer, provided between the sapphire substrate and a nitride-based light-emitting layer. For one skilled in the art, it is well-known that the quality of the nitride buffer layer would directly affect the optical-electrical property of the nitride-based semiconductor light-emitting device. With the current developed metal-organic chemical vapor deposition (MOCVD) process, so-called low temperature MOCVD GaN/AlN buffer layer can be produced at a low temperature between 400 and 800 degrees Celsius. However, there is still much room for improvement in the quality of a low temperature MOCVD GaN/AlN buffer layer, for the turn-on voltage of a nitride-based semiconductor light-emitting device which is made by solely using a low temperature MOCVD GaN buffer layer is higher than 2.9 V, which is commonly considered too high.

BRIEF SUMMARY OF THE INVENTION

In view of the above, the primary objective of the present invention is to provide a high quality composite substrate including a nitride-based single crystal layer, a semiconductor device including the composite substrate, and a method of manufacturing the composite substrate, especially referring to the composite substrate of which a nitride-based multi-layer structure thereon has lower threading dislocation defect density, and referring to a nitride-based semiconductor light-emitting device which has a turn-on voltage less than 2.9 V while provided with an input current of 20 mA. A composite substrate of a preferred embodiment of the present invention includes a substrate and a nitride-based single crystal layer which is used as a buffer layer, wherein the nitride-based single crystal layer is transformed from a annealed nitride-based poly-crystal layer, which is formed with an atomic layer deposition (ALD) process and/or a plasma-enhanced ALD process (or called a plasma-assisted ALD process) to cover an upper surface of the substrate. The nitride-based poly-crystal layer has a thickness within a certain range, whereby, a nitride-based multi-layer structure on the nitride-based single crystal layer has lower defect density.

A method of manufacturing a composite substrate of a preferred embodiment of the present invention includes the steps of: preparing a substrate first, forming a nitride-based poly-crystal layer with an atomic layer deposition process and/or a plasma-enhanced ALD process (or called a plasma-assisted ALD process) to cover an upper surface of the substrate, and finally performing an annealing process to transform the nitride-based poly-crystal layer into a nitride-based single crystal layer, which is used as a buffer layer. The nitride-based poly-crystal layer has a thickness within a certain range, whereby, a nitride-based multi-layer structure on the nitride-based single crystal layer has lower defect density.

In an embodiment, the nitride-based poly-crystal layer has a thickness of approximately between 2 nm and 100 nm. Preferably, the thickness of the nitride-based poly-crystal layer is approximately between 5 nm and 50 nm. Most preferably, the thickness of the nitride-based poly-crystal layer is approximately between 20 nm and 35 nm.

In an embodiment, the nitride-based poly-crystal layer is formed by GaN, wherein materials of GaN include a first precursor and a second precursor. The first precursor which provides the Ga element can be TMGa (trimethylgallium), TEGa (triethylgallium), $C_2H_6ClGa$ (chloro(dimethyl)gallium), $C_4H_{10}ClGa$ (chloro(diethyl)gallium), $GaBr_3$ (gallium tribromide), $GaCl_3$ (gallium trichloride), triisopropylgallium, or tris(dimethylamido)gallium. The second precursor which provides the N element can be $NH_3$, $NH_3/H_2$, $NH_3$ plasma, $N_2$ plasma, $NH_3/H_2$ plasma, or $N_2/H_2$ plasma.

In an embodiment, the nitride-based poly-crystal layer is formed by $Al_xGa_{1-x}N$, wherein $0 \leq x \leq 1$. Materials of $Al_xGa_{1-x}N$ include a first precursor, a second precursor, and a third precursor. The first precursor which provides the Al element can be TMAl (trimethylaluminum), TEAl (triethylaluminum), $C_2H_6ClAl$ (chloro(dimethyl)aluminum), $C_4H_{10}ClAl$ (chloro(diethyl)aluminum), $AlBr_3$ (aluminum tribromide), $AlCl_3$ (aluminum trichloride), aluminum sec-butoxide, diethylaluminum ethoxide, triisobutylaluminum, tris(dimethylamido)aluminum, tris(diethylamido)aluminum, or tris(ethylmethylamido)aluminum. The second precursor which provides the Ga element can be TMGa (trimethylgallium), TEGa (triethylgallium), $C_2H_6ClGa$ (chloro(dimethyl)gallium), $C_4H_{10}ClGa$ (chloro(diethyl)gallium), $GaBr_3$ (gallium tribromide), $GaCl_3$ (gallium trichloride), triisopropylgallium, or tris(dimethylamido)gallium. The third precursor which provides the N element can be $NH_3$, $NH_3/H_2$, $NH_3$ plasma, $N_2$ plasma, $NH_3/H_2$ plasma, or $N_2/H_2$ plasma.

In an embodiment, the nitride-based poly-crystal layer is formed by $B_yAl_zGa_{1-y-z}N$, wherein $0 \leq y \leq 1$, $0 \leq z \leq 1$. Materials of $B_yAl_zGa_{1-y-z}N$ include a first precursor, a second precursor, a third precursor, and a fourth precursor. The first precursor which provides the B element can be $BBr_3$ (boron tribromide) or $BCl_3$ (gallium trichloride). The second precursor which provides the Al element can be TMAl (trimethylaluminum), TEAl (triethylaluminum), $C_2H_6ClAl$ (chloro(dimethyl)aluminum), $C_4H_{10}ClAl$ (chloro(diethyl)aluminum), $AlBr_3$ (aluminum tribromide), $AlCl_3$ (aluminum trichloride), aluminum sec-butoxide, diethylaluminum ethoxide, triisobutylaluminum, tris(dimethylamido)aluminum, tris(diethylamido)aluminum, or tris(ethylmethylamido)aluminum. The third precursor which provides the Ga element can be TMGa (trimethylgallium), TEGa (triethylgallium), $C_2H_6ClGa$ (chloro(dimethyl)gallium), $C_4H_{10}ClGa$ (chloro(diethyl)gallium), $GaBr_3$ (gallium tribromide), $GaCl_3$ (gallium trichloride), triisopropylgallium, or tris(dimethylamido)gallium. The fourth precursor which provides the N element can be $NH_3$, $NH_3/H_2$, $NH_3$ plasma, $N_2$ plasma, $NH_3/H_2$ plasma, or $N_2/H_2$ plasma.

In practice, materials of the substrate can be sapphire, silicon, silicon carbide, ZnO, $LiGaO_2$, $LiAlO_2$, or other commercial materials for epitaxy.

A semiconductor device of a preferred embodiment of the present invention includes a composite substrate provided in the present invention and a multi-layer semiconductor structure. The multi-layer semiconductor structure is formed on a nitride-based single crystal layer of the composite substrate.

In an embodiment, the multi-layer semiconductor structure is a nitride-based multi-layer structure which has a light-emitting layer to form a nitride-based semiconductor light-emitting device. More specifically, a turn-on voltage of the nitride-based semiconductor light-emitting device of the present invention is less than 2.9 V.

A method of manufacturing a semiconductor device of a preferred embodiment of the present invention includes the steps of: preparing the composite substrate provided in the present invention first, and finally forming a multi-layer semiconductor structure on a nitride-based single crystal layer with a MOCVD process.

Different from the prior art, the quality of the nitride-based single crystal layer provided in the present invention is better than that of a low temperature MOCVD GaN buffer layer. The nitride-based multi-layer structure on the nitride-based single crystal layer of the nitride-based semiconductor device provided in the present invention has lower threading dislocation defect density, and the turn-on voltage of the nitride-based semiconductor light-emitting device is less than 2.9 V while provided with an input current of 20 mA.

The advantages and concept of the present invention will be best understood with the following detailed description of some illustrative embodiments in conjunction with the accompanying drawings.

DETAILED DESCRIPTION OF THE INVENTION

Figure 1:
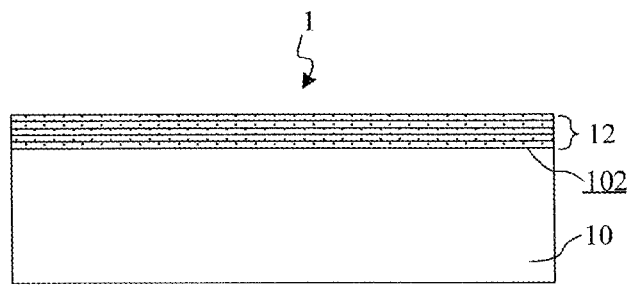
FIG. 1 is a sectional view of the composite substrate of a preferred embodiment of the present invention.

FIG. 1 is a sectional view of a composite substrate 1 of the preferred embodiment of the present invention.

The composite substrate 1 provided in the present invention is heteroepitaxy, and includes a substrate 10 and a nitride-based single crystal layer, which covers an upper surface 102 of the substrate 10 to be a buffer layer for subsequent epitaxy on a nitride-based layer. The nitride-based single crystal layer 12 is formed by applying an annealing process on a nitride-based poly-crystal layer 11 shown in FIG. 2B, wherein the nitride-based poly-crystal layer 11 has a thickness within a certain range, whereby a nitride-based multi-layer structure which subsequently grows on the nitride-based single crystal layer 12 can have lower defect density.

In an embodiment, the nitride-based poly-crystal layer 11 has a thickness of between 2 nm and 100 nm. Preferably, the thickness of the nitride-based poly-crystal layer 11 is between 5 nm and 50 nm. Most preferably, the thickness of the nitride-based poly-crystal layer 11 is between 20 nm and 35 nm. As proved by experiments, if the thickness of the nitride-based poly-crystal layer 11 is with the aforementioned range, a nitride-based semiconductor light-emitting device subsequently manufactured by epitaxy on the composite substrate 1 provided in the present invention has good optical-electrical property and lower threading dislocation defect density. Furthermore, a turn-on voltage thereof is less than 2.9 V while provided with an input current of 20 mA. Experimental data and the formation of the nitride-based single crystal layer 12 are described in details below.

Figure 2A:
FIG. 2A and FIG. 2B are sectional views of the structure obtained at different steps of the method of manufacturing a composite substrate of a preferred embodiment of the present invention.
Figure 2B:
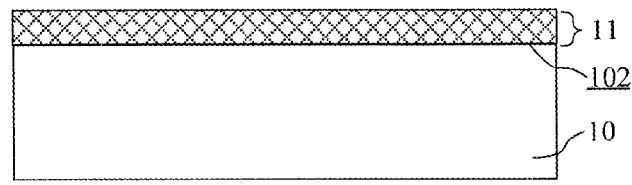

A method of manufacturing the composite substrate 1 of the preferred embodiment of the present invention is illustrated and explained in FIG. 1, FIG. 2A, and FIG. 2B.

As shown in FIG. 2A, a substrate 10 is prepared first according to the method provided in the present invention.

In practice, materials of the substrate 10 can be sapphire, silicon, silicon carbide, ZnO, LiGaO2, LiAlO2, or other commercial materials for epitaxy.

And then, as shown in FIG. 2B, the nitride-based poly-crystal layer 11 which covers the upper surface 102 of the substrate 10 is formed by using an atomic layer deposition (ALD) process and/or a plasma-enhanced ALD process (or called a plasma-assisted ALD process) according to the method provided in the present invention. Therefore, the nitride-based poly-crystal layer 11 is essentially a multi-layered and dense atomic layer structure.

Finally, an annealing process is performed according to the method provided in the present invention, which transforms the nitride-based poly-crystal layer 11 into the nitride-based single crystal layer 12. In this way, the composite substrate 1 shown in FIG. 1 is completed then.

In an embodiment, the nitride-based poly-crystal layer 11 is formed by GaN, wherein materials of GaN include a first precursor and a second precursor. The first precursor which provides the Ga element can be TMGa (trimethylgallium), TEGa (triethylgallium), $C_2H_6ClGa$ (chloro(dimethyl)gallium), $C_4H_{10}ClGa$ (chloro(diethyl)gallium), $GaBr_3$ (gallium tribromide), $GaCl_3$ (gallium trichloride), triisopropylgallium, or tris(dimethylamido)gallium. The second precursor which provides the N element can be $NH_3$, $NH_3/H_2$, $NH_3$ plasma, $N_2$ plasma, $NH_3/H_2$ plasma, or $N_2/H_2$ plasma.

In an embodiment, the nitride-based poly-crystal layer 11 is formed by $Al_xGa_{1-x}N$, wherein $0 \leq x \leq 1$. Materials of $Al_xGa_{1-x}N$ include a first precursor, a second precursor, and a third precursor. The first precursor which provides the Al element can be TMAl (trimethylaluminum), TEAl (triethylaluminum), $C_2H_6ClAl$ (chloro(dimethyl)aluminum), $C_4H_{10}ClAl$ (chloro(diethyl)aluminum), $AlBr_3$ (aluminum tribromide), $AlCl_3$ (aluminum trichloride), aluminum sec-butoxide, diethylaluminum ethoxide, triisobutylaluminum, tris(dimethylamido)aluminum, tris(diethylamido)aluminum, or tris(ethylmethylamido)aluminum. The second precursor which provides the Ga element can be TMGa (trimethylgallium), TEGa (triethylgallium), $C_2H_6ClGa$ (chloro(dimethyl)gallium), $C_4H_{10}ClGa$ (chloro(diethyl)gallium), $GaBr_3$ (gallium tribromide), $GaCl_3$ (gallium trichloride), triisopropylgallium, or tris(dimethylamido)gallium. The third precursor which provides the N element can be $NH_3$, $NH_3/H_2$, $NH_3$ plasma, $N_2$ plasma, $NH_3/H_2$ plasma, or $N_2/H_2$ plasma.

In an embodiment, the nitride-based poly-crystal layer 11 is formed by $B_yAl_zGa_{1-y-z}N$, wherein $0 \leq y \leq 1$, $0 \leq z \leq 1$. Materials of $B_yAl_zGa_{1-y-z}N$ include a first precursor, a second precursor, a third precursor, and a fourth precursor. The first precursor which provides the B element can be $BBr_3$ (boron tribromide) or $BCl_3$ (gallium trichloride). The second precursor which provides the Al element can be TMAl (trimethylaluminum), TEAl (triethylaluminum), $C_2H_6ClAl$ (chloro(dimethyl)aluminum), $C_4H_{10}ClAl$ (chloro(diethyl)aluminum), $AlBr_3$ (aluminum tribromide), $AlCl_3$ (aluminum trichloride), aluminum sec-butoxide, diethylaluminum ethoxide, triisobutylaluminum, tris(dimethylamido)aluminum, tris(diethylamido)aluminum, or tris(ethylmethylamido)aluminum. The third precursor which provides the Ga element can be TMGa (trimethylgallium), TEGa (triethylgallium), $C_2H_6ClGa$ (chloro(dimethyl)gallium), $C_4H_{10}ClGa$ (chloro(diethyl)gallium), $GaBr_3$ (gallium tribromide), $GaCl_3$ (gallium trichloride), triisopropylgallium, or tris(dimethylamido)gallium. The fourth precursor which provides the N element can be $NH_3$, $NH_3/H_2$, $NH_3$ plasma, $N_2$ plasma, $NH_3/H_2$ plasma, or $N_2/H_2$ plasma.

In practice, the formation of the nitride-based poly-crystal layer 11 can be performed at a temperature between 200 and 1200 degrees Celsius, wherein the temperature is preferably between 400 and 1200 degrees Celsius. The annealing process can be performed at a temperature between 400 and 1200 degrees Celsius under an atmosphere of $N_2$, Ar, $N_2/H_2$, $Ar/H_2$, $NH_3$, or $NH_3/H_2$, wherein the temperature for annealing is preferable between 800 and 1200 degrees Celsius. After the nitride-based poly-crystal layer 11 is annealed, the nitride-based single crystal layer 12 can be obtained in good quality.

The atomic layer deposition process adopted in the present invention has the following advantages: (1) the formation of materials can be controlled in atomic level; (2) the thickness of thin films can be controlled more precisely; (3) the products can be manufactured in large area; (4) the process provides excellent uniformity; (5) the process provides excellent conformality; (6) the structure of the products has no holes thereon; (7) the process provides low defect density; and (8) the temperature for deposition is lower.

Figure 3A:
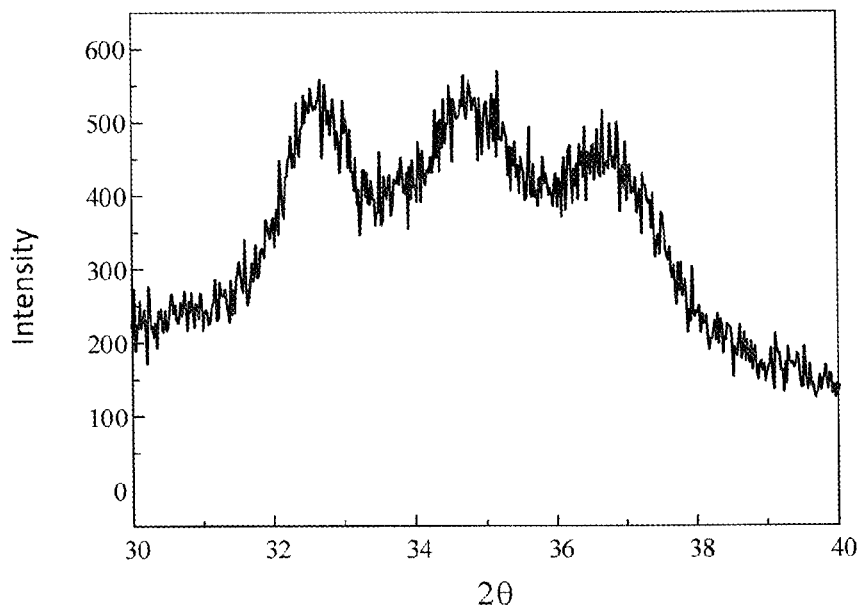
FIG. 3A is a measurement chart, showing the X-ray diffraction pattern (θ-2θ mode) of the GaN layer which grows on the sapphire substrate by using the plasma-enhanced ALD process, wherein the GaN layer has not been annealed.
Figure 3B:
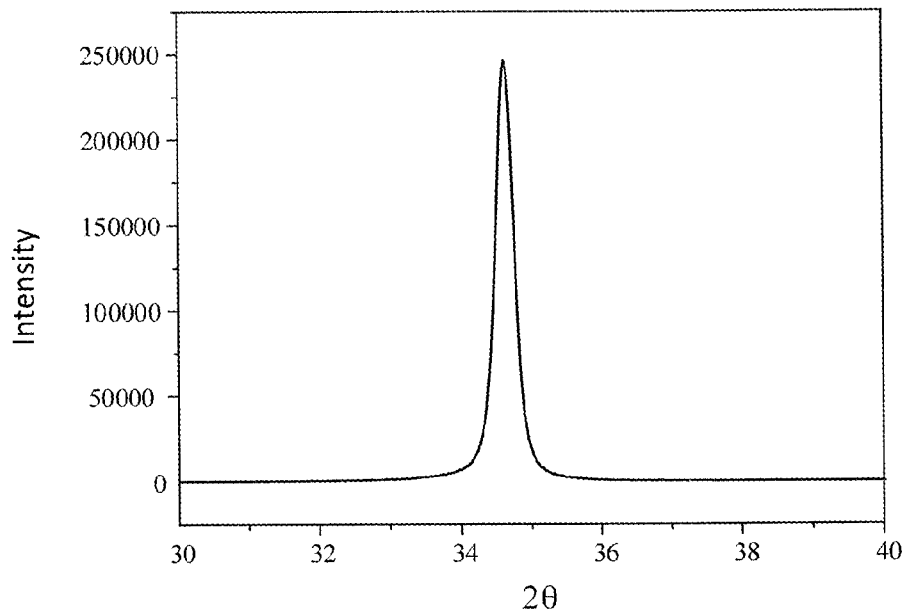
FIG. 3B is a measurement chart, showing the X-ray diffraction pattern (θ-2θ mode) of the GaN layer which grows on the sapphire substrate by using the plasma-enhanced ALD process, wherein the GaN layer has been annealed.

FIG. 3A is a measurement chart showing the X-ray diffraction pattern (θ-2θ mode) of the unannealed nitride layer (i.e., the nitride-based poly-crystal layer 11, wherein the nitride described herein and referred in measurement charts or SEM photographs provided as drawings of the present invention is GaN as an example, unless specified otherwise) deposited on a sapphire substrate, while FIG. 3B is a measurement chart showing the X-ray diffraction pattern (θ-2θ mode) of the annealed GaN layer (i.e., the nitride-based single crystal layer 12) deposited on the sapphire substrate. As shown in FIG. 3A, the unannealed GaN layer (i.e., the nitride-based poly-crystal layer 11) has a poly-crystal structure. As shown in FIG. 3B, the annealed GaN layer (i.e., the nitride-based single crystal layer 12) has a single crystal structure with a surface 002, of which the diffraction angle is 34.7°.

Figure 4A:
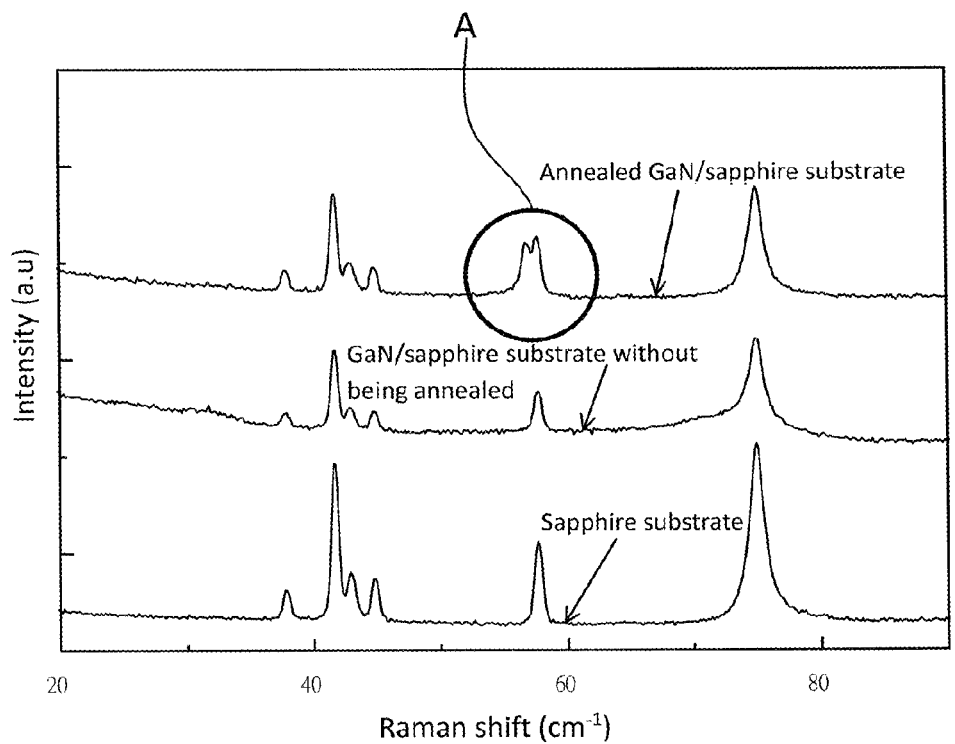
FIG. 4A is a measurement chart, showing the Raman scattering spectroscopy of the GaN layer which grows on the sapphire substrate by using the plasma-enhanced ALD process, wherein the annealed and unannealed GaN layer are both shown therein.
Figure 4B:
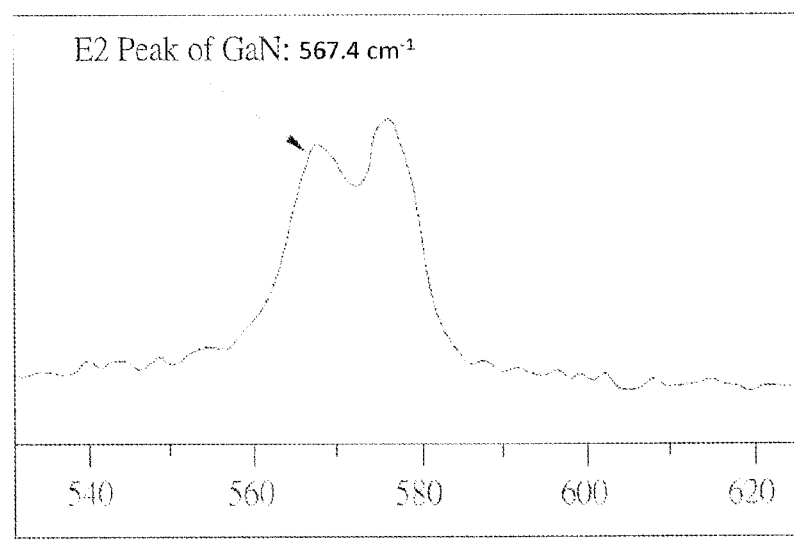
FIG. 4B is a partial enlarged view of the portion A in FIG. 4A.

FIG. 4A is a measurement chart showing the Raman scattering spectroscopy of the unannealed GaN layer (i.e., the nitride-based poly-crystal layer 11) and the annealed GaN layer (i.e., the nitride-based single crystal layer 12). As shown in FIG. 4B, the annealed GaN layer (i.e., the nitride-based single crystal layer 12) has the characteristic of a GaN single crystal, which is E2 peak (567.4 cm$^{-1}$). On the contrary, the sapphire substrate and the unannealed GaN layer (i.e., the nitride-based poly-crystal layer 11) have no E2 peak.

Figure 5:
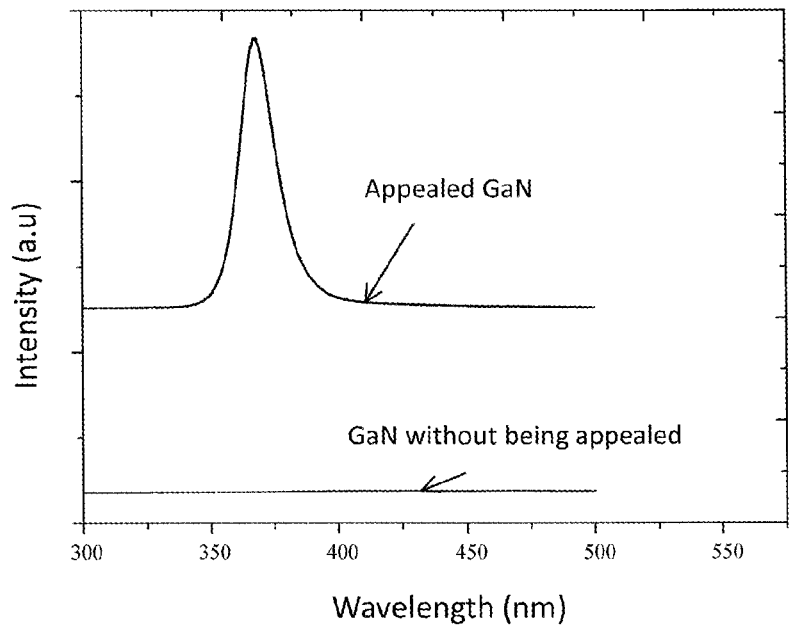
FIG. 5 is a measurement chart, showing the photoluminescence spectroscopy of the GaN layer which grows on the sapphire substrate by using the plasma-enhanced ALD process, wherein the annealed and unannealed GaN layer are both shown therein.

FIG. 5 is a measurement chart showing the photoluminescence spectroscopy of the unannealed GaN layer (i.e., the nitride-based poly-crystal layer 11) and the annealed GaN layer (i.e., the nitride-based single crystal layer 12). As shown in FIG. 5, the unannealed GaN layer (i.e., the nitride-based poly-crystal layer 11) has no near band-edge emission (NBE), while the annealed GaN layer (i.e., the nitride-based single crystal layer 12) has an obvious NBE at the wavelength of 364.1 nm.

Figure 6:
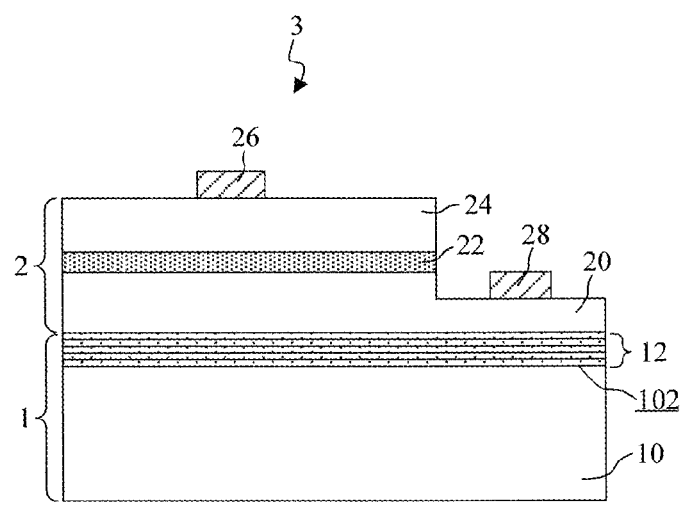
FIG. 6 is a sectional view of the nitride-based semiconductor light-emitting device of a preferred embodiment of the present invention.

FIG. 6 is a sectional view of a semiconductor device 3 of the preferred embodiment of the present invention.

The semiconductor device 3 is manufactured according to a method of manufacturing a semiconductor device of the preferred embodiment of the present invention. The first step is to prepare a composite substrate as shown in FIG. 1, which is still denoted as composite substrate 1 herein for convenience of explanation. After that, a multi-layer semiconductor structure 2 is formed on a nitride-based single crystal layer 12 of the composite substrate 1 to form the semiconductor device 3 according to the method provided in the present invention. Depending on different structures of the multi-layer semiconductor structure 2, the semiconductor device 3 can be a nitride-based semiconductor light-emitting device, a HEMT, a MOSFET, a laser diode, etc. The semiconductor device 3 manufactured with the aforementioned method includes the composite substrate 1 as shown in FIG. 1 and the multi-layer semiconductor structure 2 formed on the nitride-based single crystal layer 12.

The semiconductor device 3 shown in FIG. 6 is a nitride-based semiconductor light-emitting device 3 as an example. In this sense, the multi-layer semiconductor structure 2 is a nitride-based multi-layer structure 2, and has a light-emitting layer 22, of which the material is InGaN. Specifically, the nitride-based semiconductor light-emitting device 3 has good optical-electrical property and lower threading dislocation density. Furthermore, a turn-on voltage of the nitride-based semiconductor light-emitting device 3 is less than 2.9 V while provided with an input current of 20 mA.

The nitride-based multi-layer structure 2 shown in FIG. 6 includes epitaxy on the nitride-based single crystal layer 12, and has a first nitride-based layer 20 of a first conductive pattern. The light-emitting layer 22 is epitaxied on the first nitride-based layer 20. The nitride-based multi-layer structure 2 shown in FIG. 6 further includes a second nitride-based layer 24 of a second conductive pattern epitaxied on the light-emitting layer 22, a first electrode 26 formed on the second nitride-based layer 24, and a second electrode 28 formed on the first nitride-based layer 20. However, the structure of the nitride-based multi-layer structure 2 shown in FIG. 6 is not a limitation of the present invention.

Figure 7:
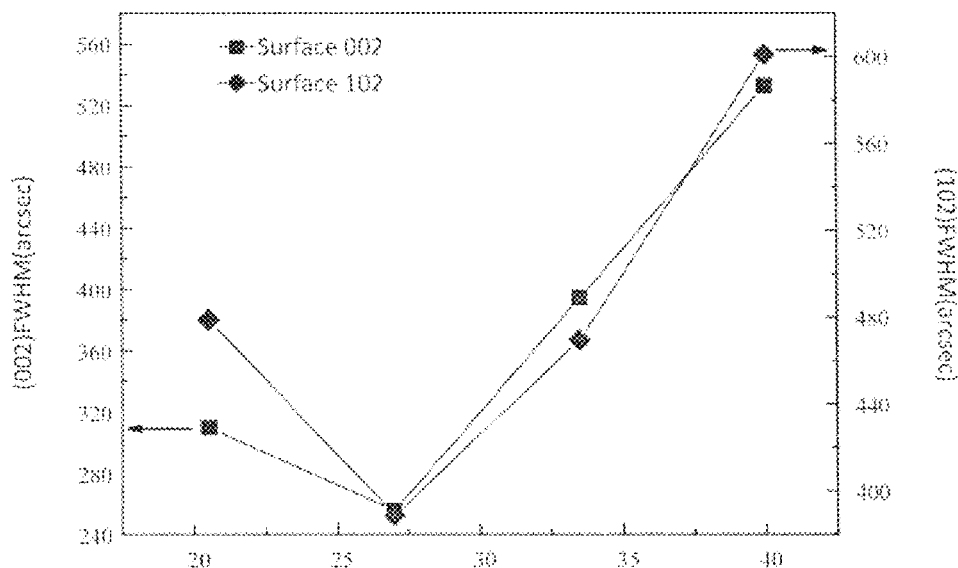
FIG. 7 is a measurement chart of the X-ray diffraction pattern (rocking curve) of single crystals formed by annealing GaN-based poly-crystal layers of different thicknesses and the GaN-based layers which grow thereon by using a MOCVD process, showing the relation between the full widths at half maximum (FWHM) of the peaks of the surface 002 and the surface 102.

Based on Table 1 below, FIG. 7 is a measurement chart of the X-ray diffraction pattern (rocking curve) of the nitride-based single crystal layer 12 formed by annealing nitride-based poly-crystal layers 11 of different thicknesses and nitride-based layers which grow thereon by using a MOCVD process, showing the relation between the full widths at half maximum (FWHM) of the peaks of the surface 002 and the surface 102. Due to the requirement of measuring an X-ray diffraction pattern, each of the nitride-based layers grow on the nitride-based single crystal layer 12 by using the MOCVD process has a thickness of 2 μm. However, it must be noted that, after being annealed, the thickness of the nitride-based single crystal layer 12 is difficult to measure, and therefore the thickness shown along the horizontal axis in FIG. 7 is the thickness of the nitride-based poly-crystal layer 11 which has not been annealed.

TABLE 1

X-ray diffraction pattern (rocking curve) of single crystals formed by annealing nitride-based poly-crystal layers 11 of different thicknesses and the nitride-based layers which grow thereon by using a MOCVD process, showing the relation between the full widths at half maximum (FWHM) of the peaks of the surface 002 and the surface 102

| Thickness of nitride-based poly-crystal layer before being annealed (nm) | (002)FWHM (arcsec) | (102)FWHM (arcsec) |
| --- | --- | --- |
| 40.0 | 532.8 | 601.2 |
| 33.5 | 394.4 | 469.4 |
| 26.8 | 255.6 | 388.8 |
| 20.5 | 309.6 | 478.8 |

As shown in FIG. 7 and Table 1, if the thickness of the nitride-based poly-crystal layer 11 is approximately between 20 nm and 35 nm, the FWHM of the nitride-based layer on the nitride-based single crystal layer 12 formed by annealing is smaller, and therefore the crystal quality is better. Especially when the thickness is 26.8 nm, the FWHM of the peak of the surface 002 is 255.6 arcsec, and that of the surface 102 is 388.8 arcsec. The thickness of the nitride-based poly-crystal layer 11 provided in the present invention is not limited to be between 20 nm and 35 nm. In practice, the thickness of the nitride-based poly-crystal layer 11 is approximately between 2 nm and 100 nm. Preferably, the thickness of the nitride-based poly-crystal layer 11 is approximately between 5 nm and 50 nm. Most preferably, the thickness of the nitride-based poly-crystal layer 11 is approximately between 20 nm and 35 nm.

The measurement results of the voltage characteristic and the relative brightness of the nitride-based semiconductor light-emitting device 3 (i.e., the structure shown in FIG. 6) manufactured by using the composite substrate provided in the present invention are listed in Table 2. The manufacturing conditions of the nitride-based single crystal layer 12 which is used as the buffer layer are listed in Table 3. At the same time, the measurement results of the voltage characteristic and the relative brightness of a nitride-based semiconductor light-emitting device manufactured by using a GaN buffer layer grown with the conventional MOCVD technique at a low temperature (500 degrees Celsius) are also listed in Table 2 for comparison. For similar purpose, the manufacturing conditions of a nitride-based layer which is manufactured by using a MOCVD process to be a buffer layer are listed in Table 3 as well, wherein a nitride-based multi-layer structure of this buffer layer is the same with the nitride-based multi-layer structure 2 shown in FIG. 6.

As shown in Table 2, the turn-on voltage of the nitride-based semiconductor light-emitting device 3 which is manufacture from the composite substrate 1 provided in the present invention is 2.75 V while provided with an input current of 20 mA. In contrary, the nitride-based semiconductor light-emitting device manufactured from the GaN buffer layer grown by using the conventional MOCVD technique at the low temperature (500 degrees Celsius) has a turn-on voltage of 2.91 V while provided with an input current of 20 mA.

In addition, no matter the provided input current is of 20 mA or 200 mA, the relative brightness of the nitride-based semiconductor light-emitting device 3 manufactured from the composite substrate 1 provided in the present invention is always higher than that of the nitride-based semiconductor light-emitting device manufactured from the GaN buffer layer grown by using the conventional MOCVD technique at the low temperature (500 degrees Celsius).

TABLE 2 while provided with input current of 20 mA and 200 mA, the voltage and the relative brightness of nitride-based semiconductor light-emitting devices which have different GaN buffer layers

| Type of buffer layer | Current (mA) | Voltage (V) | Relative brightness (a.u.) |
|---|---|---|---|
| Composite substrate provided in the present invention (the annealed GaN layer) | 20 | 2.75 (turn-on voltage) | $7.35 \times 10^{-7}$ |
| | 200 | 3.61 V | $5.80 \times 10^{-6}$ |
| GaN buffer layer grown by using MOCVD technique at low temperature (500 degrees Celsius) | 20 | 2.91 (turn-on voltage) | $5.00 \times 10^{-7}$ |
| | 200 | 3.68 | $4.86 \times 10^{-6}$ |

TABLE 3 manufacturing conditions of buffer layer for nitride-based semiconductor light-emitting devices having different GaN buffer layers

| Type of buffer layer | Manufacturing conditions |
|---|---|
| Composite substrate provided in the present invention (the annealed GaNlayer) | 1. The ALD process<br>Temperature of growth: 500° C.<br>Repeat the following steps:<br>$NH_3/H_2$ plasma<br>TEGa aeration<br>Form a nitride-based poly-crystal layer, thickness is about 26.8 nm<br>2. The annealing process<br>Condition:<br>atmosphere $NH_3/H_2$, temperature 1130° C.<br>Form a nitride-based single crystal layer |
| GaN buffer layer grown by using MOCVD technique at low temperature (500 degrees Celsius) | Temperature of growth: 500° C.<br>Atmosphere: $NH_3/H_2$<br>Form a GaN buffer layer, thickness is about 25 nm |

Figure 8:
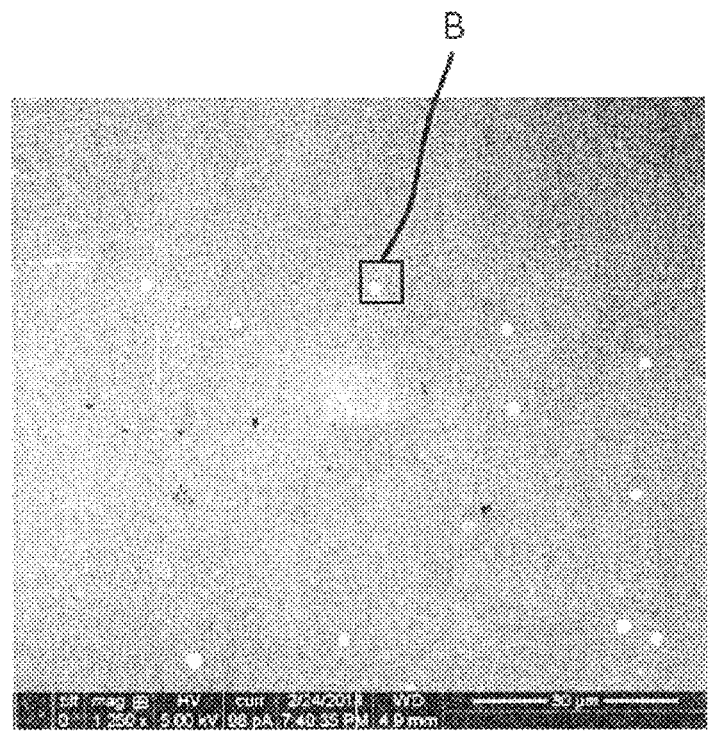
FIG. 8 is a scanning electron microscope (SEM) photograph of the semiconductor light-emitting device provided in the present invention, showing etching pits formed on the surface thereof after employing a phosphoric acid etching treatment.
Figure 9:
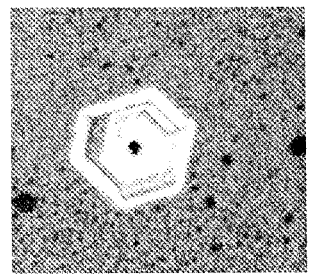
FIG. 9 is a partial enlarged view of the portion B in FIG. 8.
Figure 10:
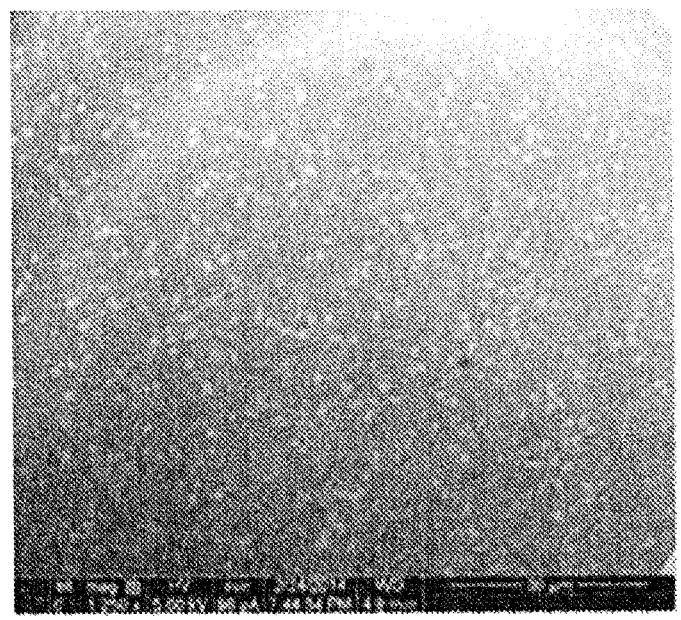
FIG. 10 is a SEM photograph of the semiconductor light-emitting device manufactured from a GaN buffer layer which is manufactured with the conventional MOCVD technique at a low temperature, showing etching pits are formed on the surface thereof after employing a phosphoric acid etching treatment.

FIG. 8 and FIG. 9 are scanning electron microscope (SEM) photographs, showing etching pits formed on a surface of the first nitride-based layer 20 on the nitride-based single crystal layer 12 of the nitride-based semiconductor light-emitting device 3 which is manufactured from the composite substrate 1 provided in the present invention after employing a phosphoric acid etching treatment. As a comparison, FIG. 10 is a SEM photograph of the nitride-based semiconductor light-emitting device manufactured from the GaN buffer layer grown by using the conventional MOCVD technique at the low temperature (500 degrees Celsius), showing etching pits formed on a surface of the first nitride-based layer of the buffer layer after employing the phosphoric acid etching treatment. The etch pit density shown in FIG. 8 and FIG. 10 approximately equals the threading dislocation density.

As obviously shown in FIG. 8 and FIG. 10, the EPD of the nitride-based semiconductor light-emitting device 3 manufactured from the composite substrate 1 provided in the present invention is about $2.2 \times 10^5$ cm$^{-2}$. As for the conventional technique, the threading dislocation density of the nitride-based semiconductor light-emitting device manufactured from the GaN buffer layer grown by using the conventional MOCVD technique at the low temperature (500 degrees Celsius) is approximately within the range of $10^7$-$10^{10}$ cm$^{-2}$. Therefore, the threading dislocation density of the nitride-based semiconductor light-emitting device 3 provided in the present invention is significantly lower than that of the nitride-based semiconductor light-emitting device manufactured from the GaN buffer layer grown by using the conventional MOCVD technique at the low temperature, which is higher than $1 \times 10^7$ cm$^{-2}$. In other words, the nitride-based semiconductor light-emitting device 3 manufactured from the composite substrate 1 provided in the present invention has lower threading dislocation density, which is not only significantly lower than the threading dislocation density (i.e., $1 \times 10^7$ cm$^{-2}$) of the nitride-based semiconductor light-emitting device manufactured from the GaN buffer layer grown by using the conventional MOCVD technique at the low temperature, but also lower than $1 \times 10^6$ cm$^{-2}$. It is hence proved that the quality of the nitride-based single crystal layer 12 provided in the present invention is better than that of a low temperature MOCVD GaN buffer layer. Therefore, the first nitride-based layer 20 on the nitride-based single crystal layer 12 has excellent crystal quality.

Figure 11:
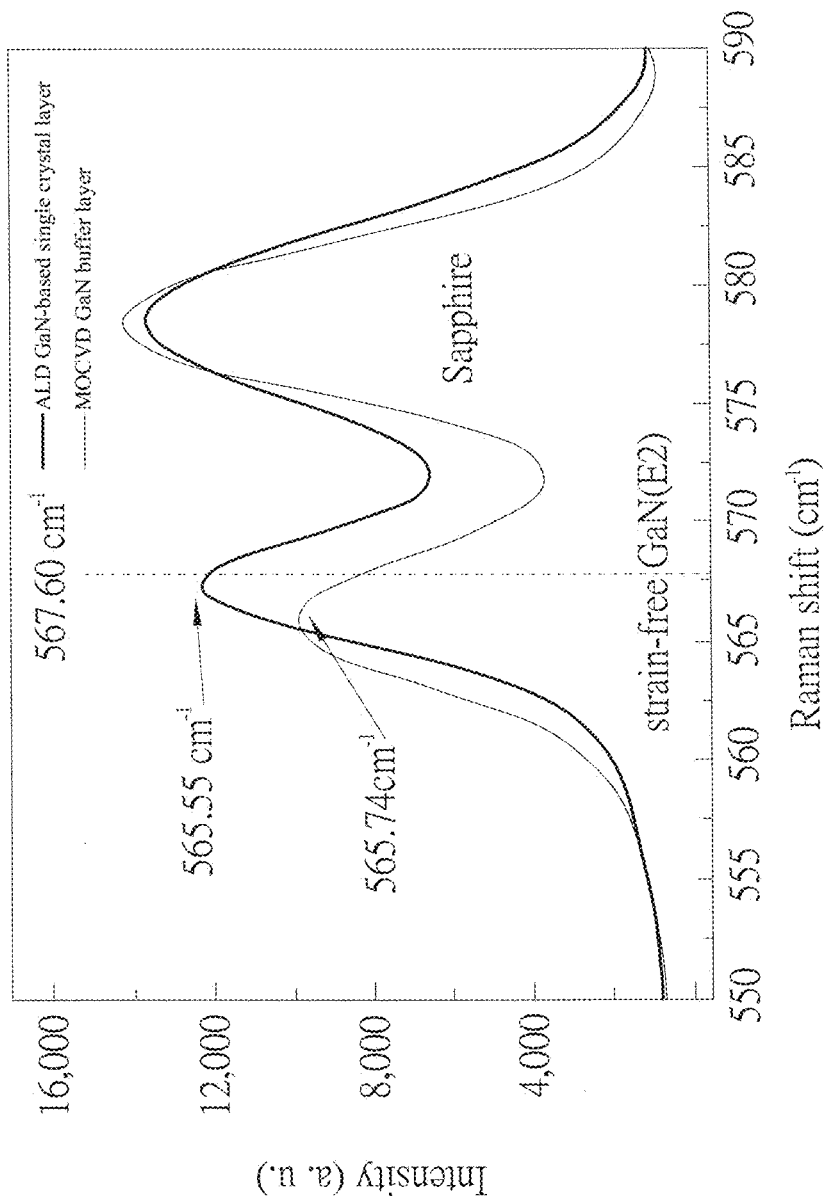
FIG. 11 is a measurement chart, showing micro-Raman spectra of a GaN-based single crystal layer, which grows on the sapphire substrate by using the remote plasma ALD (RP-ALD) process, and a MOCVD GaN buffer layer prepared with the conventional MOCVD technique.

To further emphasis the better efficacy of the disclosure of the present invention over conventional products, a micro-Raman spectra is provided as FIG. 11, wherein a GaN-based single crystal layer which grows on the sapphire substrate by using a remote plasma ALD (RP-ALD) process is compared with a MOCVD GaN buffer layer prepared with the conventional MOCVD technique. The strain-free GaN E2 peak is located at 567.6 cm$^{-1}$, as depicted as dash lien in FIG. 11. In other words, the closer to the dash line, the more strain is released. The E2 peak of the MOCVD GaN buffer layer negatively shifts 1.86 cm$^{-1}$ with respect to the dash line, while the GaN-based single crystal layer has a Raman E2 peak at 567.55 cm$^{-1}$, which is only a slight Raman shift of 0.05 cm$^{-1}$ with respect to the strain-free GaN. The low Raman shift indicates that the GaN-based single crystal layer provided in the present invention is near strain free.

Figure 12:
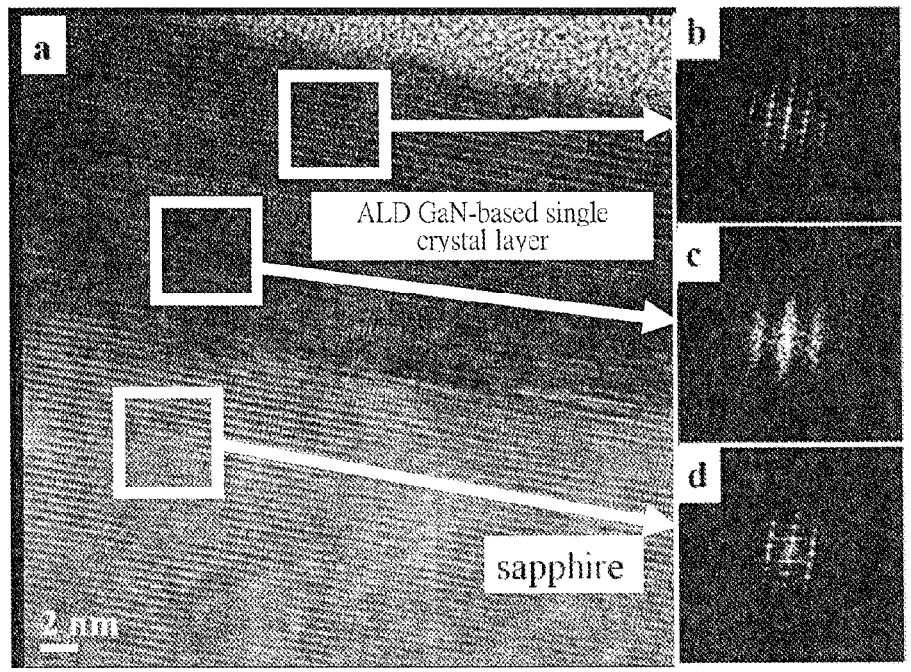
FIG. 12 is a measurement chart, showing a high-resolution transmission electron microscopy (HR-TEM) image of a cross section of a GaN-based single crystal layer prepared with the method provided in the present invention.

In addition, FIG. 12 is a series of measurement charts, wherein FIG. 12(a) is a high-resolution transmission electron microscopy (HR-TEM) image of a cross section of a GaN-based single crystal layer, which is prepared with the method provided in the present invention, along with a sapphire substrate below. The fast Fourier transform (FET) diffractograms shown in FIGS. 12(b), (c) and (d) refer to the areas enclosed in an upper region of the GaN-based single crystal layer, a bottom region of the GaN-based single crystal layer, and the sapphire substrate in this TEM image, respectively. As shown in FIG. 12(a), the GaN-based single crystal layer is composed of fine grains, and though the lattice distortion can be observed in the buffer layer, it is only within 10 nm from the interface between the buffer layer and the substrate. As shown in FIG. 12(b), a single crystal GaN thereof has wurtzite structure. As shown in FIG. 12(c), the diffraction patterns are not sharp shot, revealing that the lattice was heavily distorted in the referred region, and this heavily distorted region may absorb the misfit dislocations generated by the large lattice mismatch and hence prevent such dislocations from propagation into the upper region of the GaN-based single crystal layer. As a result, the strain caused by lattice misfit is relaxed within this heavily distorted region, leading to a near strain-free GaN-based single crystal layer.

Figure 13:
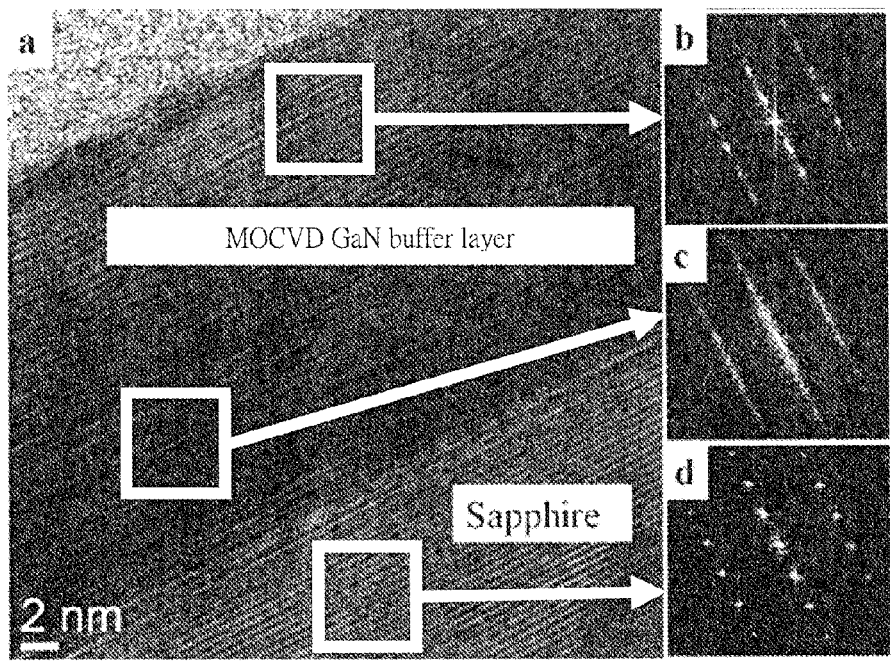
FIG. 13 is a measurement chart, showing a HR-TEM image of a MOCVD GaN buffer layer prepared with the conventional MOCVD technique as comparison.

For comparison, FIG. 13 provides another series of measurement charts as well. FIG. 13(a) is a HR-TEM image of a cross section of a MOCVD GaN buffer layer and a sapphire substrate, wherein the MOCVD GaN buffer layer is prepared with the conventional MOCVD technique. The fast Fourier transform (FFT) diffractograms shown in FIGS. 13(b), (c), and (d) refer to the areas enclosed in the upper region of the MOCVD GaN buffer layer, the bottom region of the MOCVD GaN buffer layer, and the sapphire substrate, respectively. As shown in FIG. 13(b), a single crystal GaN thereof has wurtzite structure. However, the diffraction spots are slightly deformed, revealing that the lattice was distorted in this region. As shown in FIG. 13(c), heavy distortion can be observed in the bottom region of the MOCVD GaN buffer layer, of which the deformation is heavier than that in the upper region.

As it can be seen from the above description, distortion is strictly restricted at where near the interface for the GaN-based single crystal layer provided in the present invention, and most part of the GaN-based single crystal layer generally has excellent crystalline quality, which obviously surpasses that of the conventional products.

It must be pointed out that the embodiments described above are only some preferred embodiments of the present invention. All equivalent structures and methods which employ the concepts disclosed in this specification and the appended claims should fall within the scope of the present invention.

What is claimed is:

1. A composite substrate, which is heteroepitaxy, comprising:
   a substrate; and
   a nitride-based single crystal layer, which is formed to cover an upper surface of the substrate, wherein the nitride-based single crystal layer is transformed from a annealed nitride-based poly-crystal layer which is formed with a manufacturing process of atomic layer deposition (ALD) and/or a plasma-enhanced ALD process to cover the upper surface of the substrate; the nitride-based poly-crystal layer has a thickness of approximately between 2 nm and 100 nm;
   wherein the composite substrate has a threading dislocation density less than $1 \times 10^6$ cm$^{-2}$;
   wherein the nitride-based single crystal layer has an E2 peak at 567.4 cm$^{-1}$ Raman shift in a Raman scattering spectroscopy.

2. The composite substrate of claim 1, wherein the thickness of the nitride-based poly-crystal layer is between 5 nm and 50 nm.

3. The composite substrate of claim 2, wherein the thickness of the nitride-based poly-crystal layer is between 20 nm and 35 nm.

4. The composite substrate of claim 1, wherein the nitride-based poly-crystal layer is formed by GaN, wherein materials of GaN comprise a first precursor and a second precursor; the first precursor is selected from one member of the group consisting of TMGa (trimethylgallium), TEGa (triethylgallium), $C_2H_6ClGa$ (chloro(dimethyl)gallium), $C_4H_{10}ClGa$ (chloro(diethyl)gallium), GaBr$_3$ (gallium tribromide), GaCl$_3$ (gallium trichloride), triisopropylgallium, and tris(dimethylamido)gallium; the second precursor is selected from one member of the group consisting of NH$_3$, NH$_3$/H$_2$, NH$_3$ plasma, N$_2$ plasma, NH$_3$/H$_2$ plasma, and N$_2$/H$_2$ plasma.

5. The composite substrate of claim 1, wherein the nitride-based poly-crystal layer is formed by $Al_xGa_{1-x}N$, wherein $0 \leq x \leq 1$; materials of $Al_xGa_{1-x}N$ comprise a first precursor, a second precursor, and a third precursor, wherein the first precursor is selected from one member of the group consisting of TMAl (trimethylaluminum), TEAl (triethylaluminum), $C_2H_6ClAl$ (chloro(dimethyl)aluminum), $C_4H_{10}ClAl$ (chloro(diethyl)aluminum), AlBr$_3$ (aluminum tribromide), AlCl$_3$ (aluminum trichloride), aluminum sec-butoxide, diethylaluminum ethoxide, triisobutylaluminum, tris(dimethylamido)aluminum, tris(diethylamido)aluminum, and tris(ethylmethylamido)aluminum; the second precursor is selected from one member of the group consisting of TMGa (trimethylgallium), TEGa (triethylgallium), $C_2H_6ClGa$ (chloro(dimethyl)gallium), $C_4H_{10}ClGa$ (chloro(diethyl)gallium), GaBr$_3$ (gallium tribromide), GaCl$_3$ (gallium trichloride), triisopropylgallium, and tris(dimethylamido)gallium; the third precursor is selected from one member of the group consisting of NH$_3$, NH$_3$/H$_2$, NH$_3$ plasma, N$_2$ plasma, NH$_3$/H$_2$ plasma, and N$_2$/H$_2$ plasma.

6. The composite substrate of claim 1, wherein the nitride-based poly-crystal layer is formed by $B_yAl_zGa_{1-y-z}N$, wherein $0 \leq y \leq 1$, $0 \leq z \leq 1$; materials of $B_yAl_zGa_{1-y-z}N$ comprise a first precursor, a second precursor, a third precursor, and a fourth precursor, wherein the first precursor is BBr$_3$ (boron tribromide) or BCl$_3$ (gallium trichloride); the second precursor is selected from one member of the group consisting of TMAl (trimethylaluminum), TEAl (triethylaluminum), $C_2H_6ClAl$ (chloro(dimethyl)aluminum), $C_4H_{10}ClAl$ (chloro(diethyl)aluminum), AlBr$_3$ (aluminum tribromide), AlCl$_3$ (aluminum trichloride), aluminum sec-butoxide, diethylaluminum ethoxide, triisobutylaluminum, tris(dimethylamido)aluminum, tris(diethylamido)aluminum, and tris(ethylmethylamido)aluminum; the third precursor is selected from one member of the group consisting of TMGa (trimethylgallium), TEGa (triethylgallium), $C_2H_6ClGa$ (chloro(dimethyl)gallium), $C_4H_{10}ClGa$ (chloro(diethyl)gallium), GaBr$_3$ (gallium tribromide), GaCl$_3$ (gallium trichloride), triisopropylgallium, and tris(dimethylamido)gallium; the fourth precursor is selected from one member of the group consisting of NH$_3$, NH$_3$/H$_2$, NH$_3$ plasma, N$_2$ plasma, NH$_3$/H$_2$ plasma, and N$_2$/H$_2$ plasma.

7. A semiconductor device, comprising:
   the composite substrate of claim 1, which is heteroepitaxy, and has a threading dislocation density less than $1 \times 10^6$ cm$^{-2}$; and
   a multi-layer semiconductor structure formed on the nitride-based single crystal layer of the composite substrate;
   wherein a rocking curve in X-ray diffraction pattern of the multi-layer semiconductor structure shows that a FWHM of the peak of the surface 002 is between 255.6 arcsec and 532.8 arcsec, and a FWHM of the peak of the surface 102 is between 388.8 arcsec and 478.8 arcsec.

8. The semiconductor device of claim 7, wherein the multi-layer semiconductor structure is a nitride-based multi-layer structure.

9. The semiconductor device of claim 8, wherein the nitride-based multi-layer structure is formed on the nitride-based single crystal layer with a metal-organic chemical vapor deposition (MOCVD) process, and has a light-emitting layer.

10. The semiconductor device of claim 9, wherein the semiconductor device has a turn-on voltage less than 2.9 V.

* * * * *